(12) United States Patent
Schemmann et al.

(10) Patent No.: US 7,999,631 B2
(45) Date of Patent: Aug. 16, 2011

(54) ANTI-PARALLEL PI PIN ATTENUATOR STRUCTURE WITH IMPROVED CSO PERFORMANCE

(75) Inventors: Marcel F. Schemmann, Maria Hoop (NL); Zhijian Sun, Avon, CT (US); Long Zou, Rocky Hill, CT (US)

(73) Assignee: ARRIS Group, Inc., Suwanee, GA (US)

( * ) Notice: Subject to any disclaimer, the term of this patent is extended or adjusted under 35 U.S.C. 154(b) by 107 days.

(21) Appl. No.: 12/406,045

(22) Filed: Mar. 17, 2009

(65) Prior Publication Data

US 2009/0256655 A1    Oct. 15, 2009

Related U.S. Application Data

(60) Provisional application No. 61/069,790, filed on Mar. 17, 2008.

(51) Int. Cl.
*H01P 1/22*    (2006.01)
(52) U.S. Cl. ...................................... 333/81 R; 327/308
(58) Field of Classification Search ................. 333/81 A, 333/81 R, 17.2; 327/308, 309
See application file for complete search history.

(56) References Cited

U.S. PATENT DOCUMENTS 3,529,266 A * 9/1970 King ........................... 333/81 R
7,023,294 B2 * 4/2006 Hauger et al. ............. 333/81 R

* cited by examiner

*Primary Examiner* — Stephen E Jones
(74) *Attorney, Agent, or Firm* — Troy A. Van Aacken; Robert J. Starr

(57) ABSTRACT

An RF attenuator circuit includes an anti-parallel PI structure having an input shunt arm comprising a single PIN diode, and an output shunt arm comprising a single PIN diode configured to have opposite polarity of the PIN diode of the input shunt arm.

3 Claims, 2 Drawing Sheets

ANTI-PARALLEL PI PIN ATTENUATOR STRUCTURE WITH IMPROVED CSO PERFORMANCE

PRIORITY CLAIM

The present application claims priority under 35 USC 119 to U.S. application Ser. No. 61/069,790 filed on Monday, Mar. 17, 2008, and which is incorporated herein by reference.

BACKGROUND

A 'PI' attenuator circuit such as one shown in FIG. 1 may be employed to control the amplitude levels of a modulation signal. It is an optical network, for example, such a circuit may be used to control the amplitude signal applied to modulate the output of a laser beam. Properly biased, the diodes 102, 104 may behave in the circuit as current-sensitive resistors with an impedance that varies according to the current injected from the biasing resources Vc and V+.

Shunt arms 126 and 128 shunt the input RF signals and output RF signals respectively to ground via RC circuits 104, 124, and 120, 122, which provide a DC bias potential on the diodes 106, 112 while passing non-DC bias components to ground. Likewise, the voltage divider circuits comprising resistors 102, 116, and 114 bias diodes 108 and 110. The diodes 106, 112, 108, 110 are typically PIN (P-type, Insulator, N-type) diodes. An input RF signal is attenuated by the circuit with the actual attenuation varying according to the biasing current provided by Vc and V+. The circuit thus provides a tunable RF attenuator.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Figure 1:
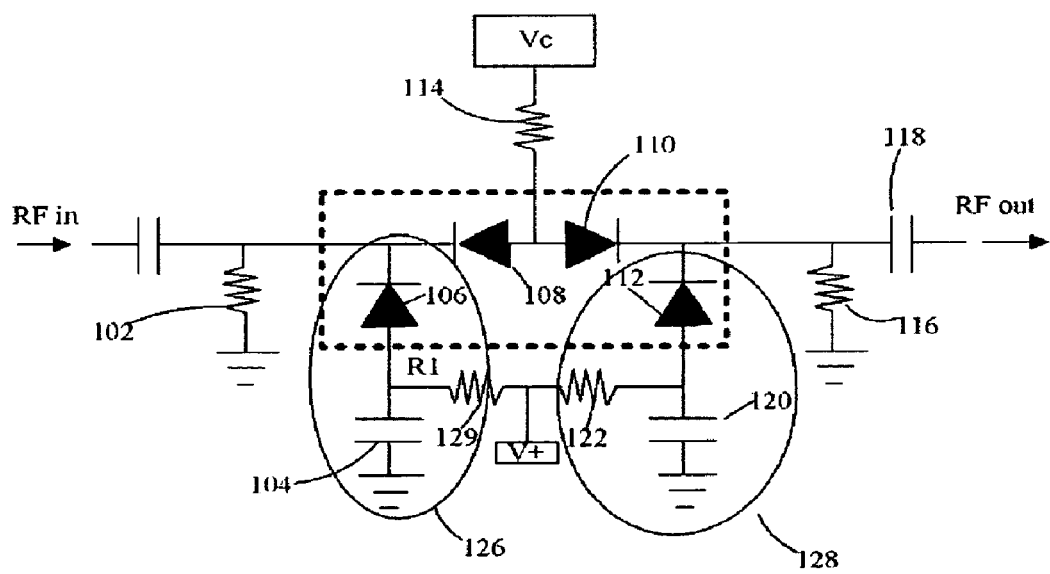
FIG. 1 is an illustration of a prior art 'PI' PIN diode attenuator.
Figure 2:
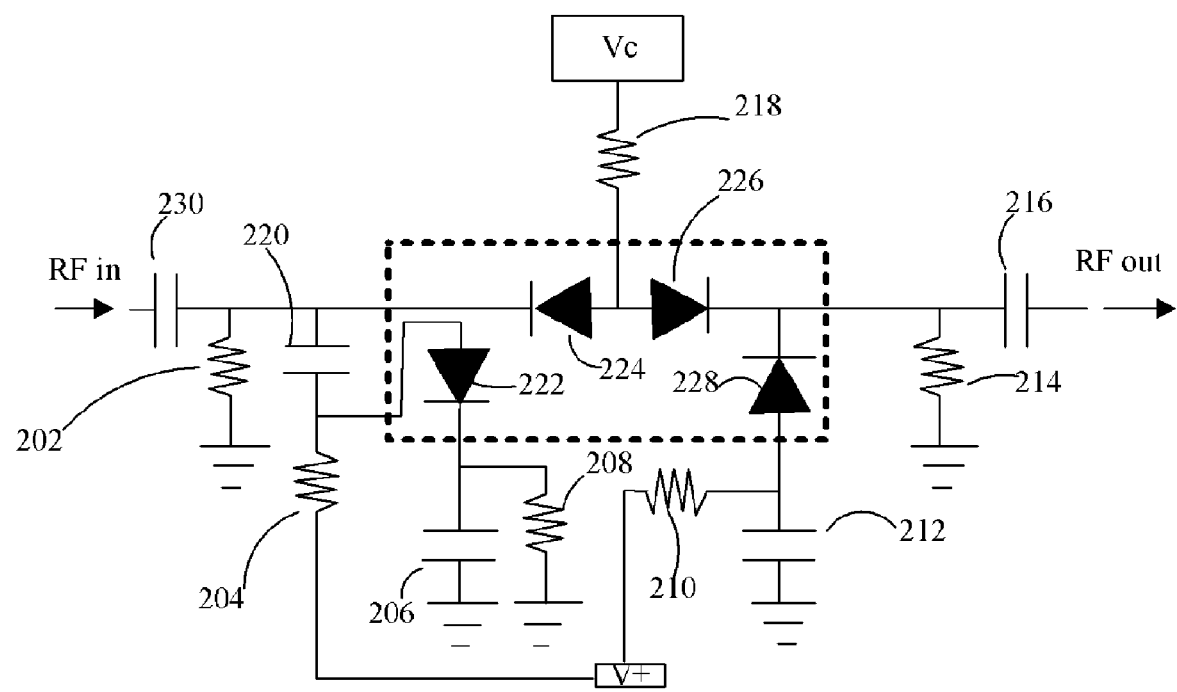
FIG. 2 is an illustration of an embodiment of a novel anti-parallel 'PI' PIN diode attenuator.

FIG. 2 shows one embodiment of logic for a novel anti-parallel 'PI' attenuator. A DC bias differential is provided by capacitor 230 and resistor 202 passing RF signals from the input while blocking DC components. A shunt arm is formed from the diode 222 and various biasing components 220, 204, 206, 208. Note that in some embodiments, resistors in the circuit of FIG. 2 may be replaced by inductors. Note also that a similar modification may be made to the output shunt arm in various embodiments, which may include one or both of input shunt arm and output shunt arm having diodes of reversed polarity. A voltage divider formed by resistor 218, 202, 214 provides a bias potential to diodes 224, 226 which in turn vary their impedance according to the current supplied by biasing source Vc, thus forming a tunable attenuator. Shunt arm comprising diode 222, capacitor 220, resistor 204, capacitor 206, and resistor 208 form an anti-parallel PI configuration with the output shunt arm comprising diode 228, resistor 210 and capacitor 212. Output capacitor 216 blocks DC components of the RF signal that may be introduced within the circuit from reaching the output.

Logic in accordance with FIG. 2 provides substantially improved CSO performance over prior art circuits and designs. Logic in accordance with FIG. 2 may be used in gain control circuits with an approximately 15 DB attenuation range and lower CSO contributions than provided by prior art PI circuits.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A radio frequency (RF) attenuator circuit comprising:
a PI topology;
back-to-back diodes in series with an input signal;
an RF input signal input shunted to ground via a first diode, the first diode having an anode terminal coupled via a capacitance to the input signal terminal and a cathode terminal coupled via a capacitance to ground, the first diode is the only diode shunting the input signal input and ground; and
an RF output signal output shunted to ground via a second diode, the second diode having a cathode terminal connected to the output signal terminal and an anode terminal coupled via a capacitance to ground, the second diode is the only diode shunting the output signal output and ground.

2. A radio frequency (RF) attenuator circuit comprising:
back-to-back diodes in series with an input signal; and
a PI structure with an RF input shunted to ground via a single P-type, Insulator, N-type (PIN) diode, and an RF output shunted to ground via a single PIN diode configured anti-parallel with the PIN diode shunting the RF input.

3. A radio frequency (RF) attenuator circuit comprising:
back-to-back P-type, Insulator, N-type (PIN) diodes in series between an RF signal input and an RF signal output;
a first voltage divider to forward bias the PIN diodes in series;
PIN diodes in anti-parallel configuration coupled to cathode terminals of the back-to-back PIN diodes, a single first PIN diode shunting the RF signal input to ground and a single second PIN diode shunting the RF signal output to ground;
a second voltage divider to forward bias one of the PIN diode of the anti-parallel configuration, and to reverse bias the other PIN diode of the anti-parallel configuration.

* * * * *